(12) United States Patent
Liu et al.

(10) Patent No.: US 11,401,598 B2
(45) Date of Patent: Aug. 2, 2022

(54) FRICTION REDUCED AND WEAR RESISTANT COATING, PREPARATION METHOD THEREOF AND PISTON RING

(71) Applicant: ASIMCO Shuanghuan Piston Ring(YiZheng) Co., Ltd., Jiangsu (CN)

(72) Inventors: Qianxi Liu, Jiangsu (CN); Bo Zhang, Jiangsu (CN); Kaishun Li, Jiangsu (CN)

(73) Assignee: ASIMCO SHUANGHUAN PISTON RING(YIZHENG) CO., LTD.

( * ) Notice: Subject to any disclaimer, the term of this patent is extended or adjusted under 35 U.S.C. 154(b) by 140 days.

(21) Appl. No.: 16/879,825

(22) Filed: May 21, 2020

(65) Prior Publication Data

US 2020/0370162 A1 Nov. 26, 2020

(51) Int. Cl.
*C23C 14/06* (2006.01)
*B08B 7/00* (2006.01)
(Continued)

(52) U.S. Cl.
CPC ........ *C23C 14/0641* (2013.01); *B08B 7/0071* (2013.01); *B08B 7/028* (2013.01);
(Continued)

(58) Field of Classification Search
CPC ...... F16J 9/26; C23C 14/0641; C23C 14/022; C23C 14/025; C23C 14/16; C23C 14/325; C23C 28/048; C23C 28/42; C23C 28/44
(Continued)

(56) References Cited

U.S. PATENT DOCUMENTS 5,601,293 A * 2/1997 Fukutome .................. F16J 9/26
 277/444
6,060,182 A * 5/2000 Tanaka ........................ F16J 9/26
 277/443

(Continued)

FOREIGN PATENT DOCUMENTS

CN 104388899 A 3/2015
EP 2907889 A1 8/2015

OTHER PUBLICATIONS

Extended European Search Report dated Oct. 22, 2020. European Patent Application No. 20176159.0.
(Continued)

*Primary Examiner* — Archene A Turner
(74) *Attorney, Agent, or Firm* — McDonald Hopkins LLC

(57) ABSTRACT

Provided are a friction reduced and wear resistant coating, a preparation method thereof and a piston ring. The coating includes an adhesive layer, a transition layer, a gradient layer and a function layer in sequence. The gradient layer is a $CrMo_xN$ layer in which Mo content progressively increases. The function layer includes at least one cyclical layer. Each cyclical layer includes a first $CrMo_xN$ layer and a second $CrMo_xN$ layer in sequence from bottom to top. The Mo content of the first $CrMo_xN$ layer is lower than the Mo content of the second $CrMo_xN$ layer. The coating provided by the present invention has a friction coefficient of 0.3 to 0.45, 10% to 30% lower than a CrN coating, and has an overall hardness of up to 1400 HV to 2600 HV and a thickness of 80 μm, satisfying the required durability for the full lifecycle of the piston ring. The preparation process of the coating is simple and highly operable, and thus is convenient for industrialization.

19 Claims, 2 Drawing Sheets

(51) Int. Cl.
  *B08B 7/02* (2006.01)
  *C23C 14/02* (2006.01)
  *C23C 14/16* (2006.01)
  *C23C 14/32* (2006.01)
  *F16J 9/26* (2006.01)
  *C23C 28/00* (2006.01)

(52) U.S. Cl.
  CPC .......... *C23C 14/022* (2013.01); *C23C 14/025* (2013.01); *C23C 14/16* (2013.01); *C23C 14/325* (2013.01); *C23C 28/42* (2013.01); *F16J 9/26* (2013.01)

(58) Field of Classification Search
  USPC .......................................... 428/697, 698, 699
  See application file for complete search history.

(56) References Cited

U.S. PATENT DOCUMENTS

| | | | |
|---|---|---|---|
| 2013/0134033 A1* | 5/2013 | Lyo .................... | C23C 14/0641 |
| | | | 204/192.15 |
| 2015/0211635 A1 | 7/2015 | Wu et al. | |
| 2018/0135164 A1* | 5/2018 | Karner ................. | C23C 14/325 |
| 2019/0153584 A1* | 5/2019 | Karner ................ | C23C 14/0021 |

OTHER PUBLICATIONS

Office Action dated May 19, 2021; Japanese Patent Application No. 2020-088993.

* cited by examiner

FRICTION REDUCED AND WEAR RESISTANT COATING, PREPARATION METHOD THEREOF AND PISTON RING

TECHNICAL FIELD

The present disclosure belongs to the field of surface treatment, relates to a coating, a preparation method thereof and uses thereof and, in particular, relates to a friction reduced and wear resistant coating, a preparation method thereof and a piston ring.

BACKGROUND

To adapt to increasingly tightened fuel consumption standards, an effective manner is to improve the combustion efficiency of an engine and reduce the friction losses of the components of the engine. The friction loss of a piston assembly accounts for 40% to 60% of the total friction loss of a vehicle engine. Thus, it is critical to reduce the friction loss of the piston assembly and it is required that a piston ring have as low friction performance as possible throughout the service life of the piston ring.

To improve the efficiency and service life of a piston system, a high-hardness wear-resistant coating is gradually widely used. However, despite being able to greatly improve the wearability lifetime of the friction pair of a cylinder liner and a piston ring, the hard coating has little influence on the friction coefficient during the relative movement. There are two development directions. First, one development direction is a laminated coating having hardness and softness coordinated. A combination of a wear-resistant hard coating and a friction-reduced soft coating can reduce both friction and wear. It is reported that physical vapor deposition of a CrTiAlN/MoST composite coating is performed on a cold die steel Cr12MoV, the advantageous support of the CrTiAlN coating allows the MoST coating to exert its lubrication sufficiently, and the MoST coating significantly reduces the friction coefficient of the CrTiAlN coating and effectively prolongs the lifetime of the coating. However, there are significant limitations in the friction reduction effect of the MoST coating. The soft outer coating causes the hardness of the composite coating to be significantly lower than that of a conventional hard coating. Moreover, once the soft outer coating peels off, the friction reduction effect disappears and the wear rate of the composite coating tends to increase. Second, an effective method is to deposit a diamond-like coating having both low friction and less wear. However, the bottleneck of the current application and popularization of the diamond-like coating is that the diamond-like coating prepared by the related art has a high internal stress. The larger the thickness of the coating, the larger the stress. When the thickness of the coating exceeds 10 μm, the high internal stress perceived by the coating itself makes the coating easily peeled off. As a result, the prepared coating is prevented from having a larger thickness and a longer service lifetime.

CN103789725A discloses a multi-layer multi-element composite hard PVD coating on the surface of a piston ring. The coating includes a single-metal priming layer, a single-nitride transition layer, a single-nitride coating, a multi-nitride transition layer and a multi-nitride coating in sequence from bottom to top. The single metal is Cr. The single nitride is CrN. The multi-nitride is Cr(Me)N. Me is one of or a combination of at least two of Al, Mo, W, B, Si or Ti. The coating is a five-layer structure having a total thickness of up to 60 μm. The coating is high in strength of bonding with the surface of the piston ring, high in hardness, low in friction coefficient and good in wear resistance. The friction coefficient of a single-TiN coating or a single-CrN coating can be further reduced by 5% to 20% when the added amount of the additive element Al, Mo, W, B, Si or Ti is controlled. However, the wear resistance, durability and friction-reducing effect of the PVD coating need to be further improved.

SUMMARY

In view of the disadvantages of the related art, an object of the present disclosure is to provide a friction reduced and wear resistant coating, a preparation method thereof and a piston ring. The coating has a strong inter-layer bonding force, a high hardness, a small friction coefficient, a wear-resistant and friction-reducing effect and a long lifecycle.

For this purpose, the present disclosure adopts the solution described below.

In a first aspect, the present disclosure provides a friction reduced and wear resistant coating. The coating is located on the surface of a substrate. The coating includes an adhesive layer, a transition layer, a gradient layer and a function layer in sequence in a direction away from the surface of the substrate.

The gradient layer is a $CrMo_xN$ layer in which Mo content progressively increases from 2.0-3.0 wt % to 3.0-6.0 wt %. The gradient layer is a $CrMo_xN$ layer in which Mo content progressively increases, which effectively reduces the internal stress of the coating and ensures that a thicker coating is deposited.

The function layer includes at least one cyclical layer, for example, 2, 3, 5, 7, 9, 10, 12, 15, 17, 19, 21, 25 or 30 cyclical layers. Each cyclical layer includes a first $CrMo_xN$ layer and a second $CrMo_xN$ layer in sequence from bottom to top. The Mo content of the first $CrMo_xN$ layer is lower than that of the second $CrMo_xN$ layer.

The number of cyclical layers may be selected by a person skilled in the art according to the need of the substrate. When the function layer includes at least two cyclical layers, the function layer is a cyclical amplitude modulation structure. The cyclical amplitude modulation structure ensures that the Mo content of the coating varies apparently cyclically so that the coating has a thickness up to 80 μm, which means the thickness of the coating is greatly increased. The Mo content of the first CrMoxN layer is lower than the Mo content of the second CrMoxN layer so that the inter-layer internal stress is reduced and the inter-layer bonding force is increased, thereby facilitating increase of the thickness of the coating.

In a preferred solution of the present disclosure, the first $CrMo_xN$ layer has Mo content of 3.0 wt % to 6.0 wt %, for example, 3.2 wt %, 3.5 wt %, 3.8 wt %, 4.1 wt %, 4.5 wt %, 4.8 wt %, 5.1 wt %, 5.3 wt %, 5.5 wt % or 5.8 wt %.

Preferably, the second $CrMo_xN$ layer has Mo content of 10.0 wt % to 15.0 wt %, for example, 10.2 wt %, 10.3 wt %, 10.5 wt %, 10.8 wt %, 11.2 wt %, 11.5 wt %, 11.8 wt %, 12.2 wt %, 12.5 wt %, 12.8 wt %, 13.1 wt %, 13.5 wt %, 13.8 wt %, 14.3 wt % or 14.8 wt %.

The adhesive layer serves to ensure that the coating has a good bonding ability. The transition layer serves to reduce the internal stress of the coating while ensuring the inherent basic requirement for wear resistance. The gradient layer serves to reduce the internal stress of the coating while ensuring the inherent requirement for wear resistance and low friction. The function layer serves to have both high wear resistance and low friction.

In a preferred solution of the present disclosure, the function layer includes 4 to 20 cyclical layers, for example, 5, 6, 7, 8, 9, 10, 12, 15, 18 or 19 cyclical layers.

In a preferred solution of the present disclosure, the adhesive layer is a Cr layer.

Preferably, the transition layer is a CrN layer and/or a $Cr_2N$ layer.

Preferably, the substrate is a piston ring made of steel and/or cast iron. The substrate may be another object that is selected by a person skilled in the art according to practical needs.

In a preferred solution of the present disclosure, the coating has a thickness of 10 μm to 80 μm, for example, 12 μm, 15 μm, 18 μm, 20 μm, 23 μm, 25 μm, 28 μm, 31 μm, 35 μm, 38 μm, 40 μm, 42 μm, 45 μm, 48 μm, 50 μm, 52 μm, 55 μm, 57 μm, 60 μm, 61 μm, 65 μm, 68 μm, 70 μm, 72 μm, 75 μm or 78 μm. The thickness of the coating may be determined by a person skilled in the art according to practical needs such as the material of the substrate or the uses of the substrate. The thickness of the coating can be up to 80 μm from which it can be seen that the bonding force between the layers of the coating is strong.

Preferably, the function layer has a thickness of 7.5 μm to 55 μm, for example, 7.8 μm, 8.1 μm, 8.3 μm, 8.5 μm, 9.5 μm, 10.0 μm, 10.3 μm, 10.5 μm, 11.0 μm, 11.5 μm, 11.8 μm, 12.0 μm, 12.5 μm, 13.0 μm, 14.0 μm, 15.0 μm, 18.0 μm, 20.0 μm, 21.0 μm, 22.0 μm, 23.5 μm, 28.3 μm, 30.2 μm, 34.3 μm, 38.1 μm, 40.3 μm, 43.6 μm, 48.5 μm, 50.2 μm or 53.4 μm.

Preferably, the ratio of the thickness of the second $CrMo_xN$ layer to that of the first $CrMo_xN$ layer is (2-3):1, for example, 2.1:1, 2.3:1, 2.5:1, 2.8:1 or 2.9:1.

Preferably, the adhesive layer has a thickness of 0.5 μm to 3 μm, for example, 0.8 μm, 1.0 μm, 1.2 μm, 1.5 μm, 1.8 μm, 2.1 μm, 2.3 μm, 2.5 μm or 2.7 μm.

Preferably, the transition layer has a thickness of 1 μm to 11 μm, for example, 1.5 μm, 2 μm, 3 μm, 4 μm, 5 μm, 6 μm, 7 μm, 8 μm, 9 μm or 10 μm.

Preferably, the gradient layer has a thickness of 1 μm to 11 μm, for example, 1.5 μm, 2 pin, 3 pin, 4 μm, 5 μm, 6 μm, 7 μm, 8 nm, 9 μm or 10 μm.

In a second aspect, the present disclosure provides a piston ring. The preceding coating is coated on the surface of the coating. A piston ring in which surface has the preceding coating has an excellent wear-resistant and friction-reducing effect. This effect greatly prolongs the service life of the piston ring.

In a third aspect, the present disclosure provides a preparation method of the coating as described in the second aspect. The preparation method includes the steps described below.

(1) cleaning the surface of the substrate to obtain a cleaned substrate;
(2) depositing the adhesive layer on the surface of the substrate by using a multi-arc ion plating device;
(3) depositing the transition layer on a surface of the adhesive layer by using the multi-arc ion plating device;
(4) depositing the gradient layer on a surface of the transition layer by using the multi-arc ion plating device; and
(5) depositing the at least one cyclical layer on a surface of the gradient layer by using the multi-arc ion plating device to form the function layer and obtain the coating.

The coating may be prepared by a multi-arc ion plating device. The multi-arc ion plating device may be selected from PVP multi-arc ion plating devices.

In a preferred solution of the present disclosure, the cleaning in the step (1) includes the steps described below.

(a) degreasing the surface of the substrate and subjecting the surface of the substrate to ultrasonic cleaning, drying the substrate, loading the substrate into the multi-arc ion plating device, heating the substrate to 380° C. to 450° C., for example, 385° C., 390° C., 395° C., 400° C., 405° C., 410° C., 415° C., 420° C., 430° C., 440° C. or 445° C., and then vacuumizing the multi-arc ion plating device to below $5.0 \times 10^{-3}$ Pa, for example, $4.5 \times 10^{-3}$ Pa, $4.3 \times 10^{-3}$ Pa, $4.1 \times 10^{-3}$ Pa, $3.8 \times 10^{-3}$ Pa, $3.5 \times 10^{-3}$ Pa, $3.1 \times 10^{-3}$ Pa, $2.8 \times 10^{-3}$ Pa, $2.5 \times 10^{-3}$ Pa, $2.1 \times 10^{-3}$ Pa, $1.8 \times 10^{-3}$ Pa, $1.5 \times 10^{-3}$ Pa, $0.5 \times 10^{-3}$ Pa or $0.1 \times 10^{-3}$ Pa; and (b) passing 99.99% pure Ar to the multi-arc ion plating device, letting Ar ions bombarding and cleaning the surface of the substrate at a negative bias voltage of −800 V to −1200 V, for example, −850 V, −900 V, −1000 V, −1050 V, −1100 V or −1150 V;

Process conditions for the depositing the adhesive layer in the step (2) include a metal Cr target as a cathode, Ar as a working reactant gas, a cathode current of 80 A to 120 A, for example, 82 A, 88 A, 94 A, 100 A, 108 A or 116 A, a pressure of 1 Pa to 2 Pa, for example, 1.1 Pa, 1.2 Pa, 1.3 Pa, 1.5 Pa, 1.7 Pa or 1.9 Pa, and a negative bias voltage of −17 V to −23 V applied to the substrate, for example, −18 V, −19 V, −20 V, −21 V, −22 V or −22.5 V, Preferably, process conditions for depositing the transition layer in the step (3) include a metal Cr target as a cathode, $N_2$ as a working reactant gas, a cathode current of 80 A to 120 A, for example, 82 A, 88 A, 94 A, 100 A, 108 A or 116 A, a pressure of 4 Pa to 6 Pa, for example, 4.2 Pa, 4.5 Pa, 4.8 Pa, 5.0 Pa, 5.2 Pa, 5.5 Pa or 5.8 Pa, and a negative bias voltage of −30 V to −40 V applied to the substrate, for example, −31 V, −32 V, −33 V, −35 V, −37 V, −38 V or −39 V, Preferably, process conditions for depositing the gradient layer in the step (4) include a metal Cr target and a metal CrMo target as a cathode, $N_2$ as a working reactant gas, a pressure of 4 Pa to 6 Pa, for example, 4.2 Pa, 4.5 Pa, 4.8 Pa, 5.0 Pa, 5.2 Pa, 5.5 Pa or 5.8 Pa, a negative bias voltage of −30 V to −40 V applied to the substrate, for example, −31 V, −32 V, −33 V, −35 V, −37 V, −38 V or −39 V, and a progressively increased CrMo cathode current from 30 A to 45 A to 40 A to 55 A, for example, a progressively increased CrMo cathode current from 30 A to 40 A, a progressively increased CrMo cathode current from 30 A to 45 A, a progressively increased CrMo cathode current from 30 A to 50 A, a progressively increased CrMo cathode current from 30 A to 55 A, a progressively increased CrMo cathode current from 35 A to 40 A, a progressively increased CrMo cathode current from 35 A to 45 A, a progressively increased CrMo cathode current from 35 A to 50 A, a progressively increased CrMo cathode current from 35 A to 55 A, a progressively increased CrMo cathode current from 40 A to 45 A, a progressively increased CrMo cathode current from 40 A to 50 A, a progressively increased CrMo cathode current from 40 A to 55 A, a progressively increased CrMo cathode current from 45 A to 50 A, or a progressively increased CrMo cathode current from 45 A to 55 A.

Preferably, process conditions for depositing the at least one cyclical layer in the step (5) include a metal Cr target and a metal CrMo target as a cathode, $N_2$ as a working reactant gas, a pressure of 4 Pa to 6 Pa, for example, 4.2 Pa, 4.5 Pa, 4.8 Pa, 5.0 Pa, 5.2 Pa, 5.5 Pa or 5.8 Pa, a negative bias voltage of −30 V to −40 V applied to the substrate, for example, −31 V, −32 V, −33 V, −35 V, −37 V, −38 V or −39 V, and a CrMo cathode current of 40 A to 55 A, for example, 42 A, 43 A, 45 A, 48 A, 50 A, 52 A or 54 A, for depositing the first $CrMo_xN$ layer; and a metal Cr target and a metal CrMo target as a cathode, $N_2$ as a working reactant gas, a pressure of 4 Pa to 6 Pa, for example, 4.2 Pa, 4.5 Pa, 4.8 Pa, 5.0 Pa, 5.2 Pa, 5.5 Pa or 5.8 Pa, a negative bias voltage of −30 V to −40 V applied to the substrate, for example, −31 V, −32 V, −33 V, −35 V, −37 V, −38 V or −39 V, and a CrMo cathode current of 80 A to 95 A, for example, 82 A, 83 A, 85 A, 88 A, 90 A, 92 A or 94 A, for depositing the second $CrMo_xN$ layer.

Preferably, the step (5) includes depositing 4 to 20 cyclical layers, for example, 5, 6, 7, 8, 9, 10, 12, 15, 18 or 19 cyclical layers.

Preferably, total duration of deposition process of the step (2) to the step (5) is 8 h to 39 h, for example, 10 h, 12 h, 14 h, 16 h, 18 h, 20 h, 22 h, 24 h, 26 h, 28 h, 30 h, 32 h, 34 h, 36 h or 38 h.

In a preferred solution of the present disclosure, the preparation method of the coating includes the steps described below.

(1) cleaning the surface of the substrate to obtain a cleaned substrate; the cleaning specifically comprising:
 (a) degreasing the surface of the substrate and subjecting the surface of the substrate to ultrasonic cleaning, dying the substrate, loading the substrate into the multi-arc ion plating device, heating the substrate to 380° C. to 450° C., and then vacuumizing the multi-arc ion plating device to below $5.0 \times 10^{-3}$ Pa; and
 (b) passing 99.99% pure Ar to the multi-arc ion plating device, letting Ar ions bombarding and cleaning the surface of the substrate at the negative bias voltage of 800 V to 1200 V;

(2) depositing the adhesive layer, a Cr layer, on the surface of the substrate under the following process conditions: a metal Cr target as a cathode, Ar as a working reactant gas, a cathode current of 80 A to 120 A, a pressure of 1 Pa to 2 Pa, and a negative bias voltage of 17 V to 23 V applied to the substrate;

(3) depositing the transition layer, a CrN layer and/or a $Cr_2N$ layer, on the Cr layer under the following process conditions: a metal Cr target as a cathode, $N_2$ as a working reactant gas, a cathode current of 80 A to 120 A, a pressure of 4 Pa to 6 Pa, and a negative bias voltage of 30 V to 40 V applied to the substrate;

(4) depositing the $CrMo_xN$ layer in which Mo content progressively increases under the following process conditions: a metal Cr target and a metal CrMo target as a cathode, $N_2$ as a working reactant gas, a pressure of 4 Pa to 6 Pa, a negative bias voltage of −30 V to −40 V applied to the substrate, and a progressively increased CrMo cathode current from 30 A to 45 A to 40 A to 55 A;

(5) depositing the first $CrMo_xN$ layer under the following process conditions: a metal Cr target and a metal CrMo target as a cathode, $N_2$ as a working reactant gas, a pressure of 4 Pa to 6 Pa, a negative bias voltage of 30 V to −40 V applied to the substrate, and a CrMo cathode current of 40 A to 55 A; and then depositing the second $CrMo_xN$ layer under the following process conditions: a metal Cr target and a metal CrMo target as a cathode, $N_2$ as a working reactant gas, a pressure of 4 Pa to 6 Pa, a negative bias voltage of −30 V to −40 V applied to the substrate, and a CrMo cathode current of 80 A to 95 A; and (6) repeating the step (5) for 4 to 20 cycles until the end of the process duration, and taking the substrate out after the furnace temperature is lower than 150° C. to obtain the coating on the surface of the substrate.

Total duration of deposition process of the step (2) to the step (5) is 8 h to 39 h.

The numerical ranges described herein contain not only the point values listed above, but also unlisted point values in the numerical ranges. Due to limitation by the length of the present application and for the sake of brevity, not all point values in the numerical ranges are listed herein.

Compared with the related art, the present disclosure has the advantages described below.

(1) Compared with an existing CrN coating, the coating provided herein is reduced by 10% to 30% in the overall friction performance. A typical CrN coating has a friction coefficient of 0.60 to 0.70 while the coating provided herein has a friction coefficient of 0.3 to 0.45. Additionally, the coating provided herein has an overall hardness of up to 1400 HV to 2600 HV. It can be seen from this hardness that the coating provided herein has a large hardness and thus is wear-resistant. In particular, a $CrMo_xN$ layer having a high Mo content is used on the outermost surface of the coating provided herein, facilitating the running-in of the piston ring at the initial running stage of the engine.

(2) The coating provided herein is a layered structure. The layered structure effectively avoids the continuous growth of defects (such as droplets and thick columnar crystals) in the coating to ensure that the thickness of the coating is increased. Additionally, the Mo content of the coating varies apparently cyclically, thereby eliminating the internal stress between the layers of the coating, ensuring the continuous growth of the coating and thus achieving the purpose of an ultra-thick (10 μm to 80 μm) coating. Compared with the thickness of a conventional abrasive CrN coating, the thickness of the coating is increased from about 8 μm to 10-80 μm, satisfying the required durability for the full lifecycle of the piston ring.

(3) The coating provided herein is of simple preparation process and good operability. As a CrMo alloy target is used, the function layer can be easily formed through a periodic variation in the cathode current, which is convenient for industrialization.

BRIEF DESCRIPTION OF DRAWINGS

In FIG. 1, 1—substrate; 2—adhesive layer; 3—transition layer; 4—gradient layer; 5—first $CrMo_xN$ layer; 6—second $CrMo_xN$ layer; and 7—function layer.

In FIG. 2, the dashed line indicates the Cr content and the solid line indicates the Mo content.

DETAILED DESCRIPTION

The present disclosure is further described below through embodiments with reference to drawings.

Figure 1:
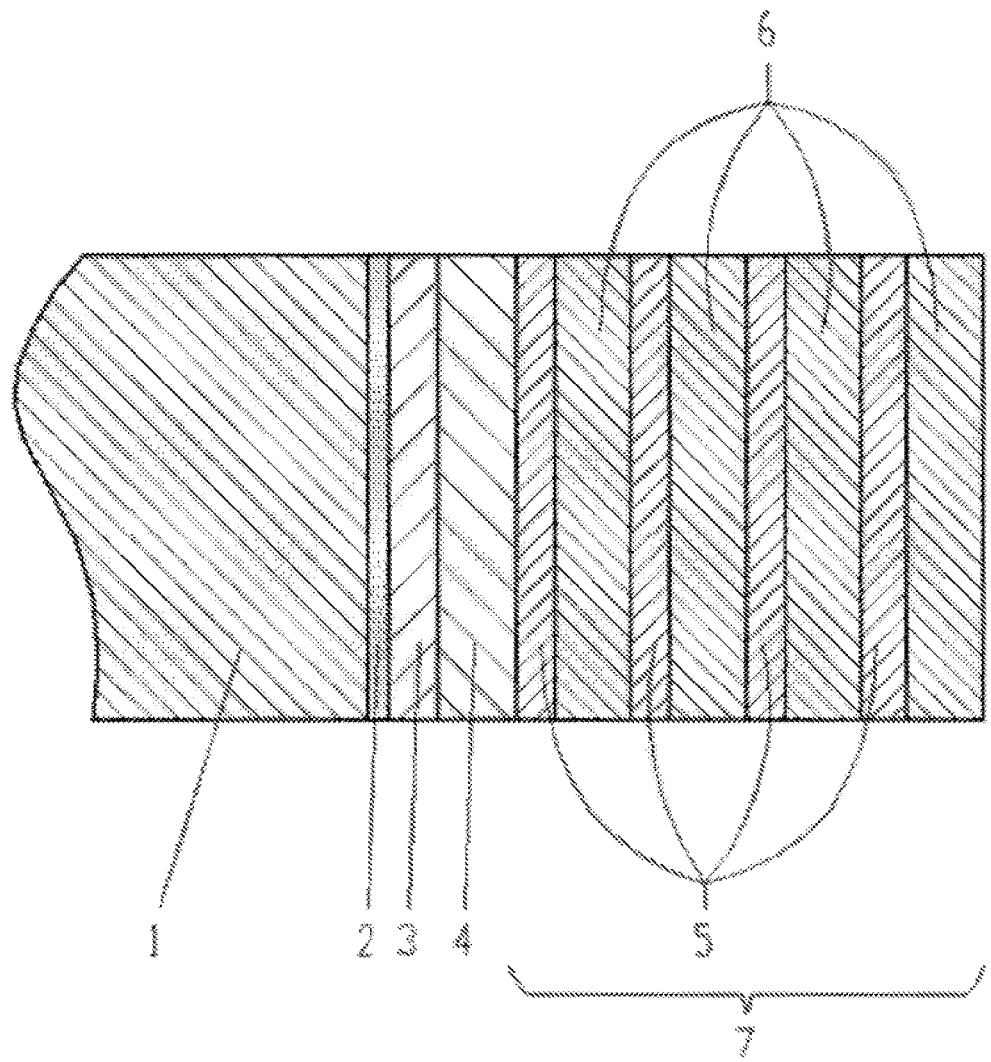
FIG. 1 is a structure diagram of a coating on the surface of a substrate according to an embodiment of the present disclosure.

In one embodiment, as shown in FIG. 1, the present disclosure provides a coating having a thickness of 10 μm to 80 μm, the coating includes an adhesive layer 2, a transition layer 3, a gradient layer 4 and a function layer 7 in sequence, and the adhesive layer 2 is in direct contact with the surface of a substrate 1.

The adhesive layer 2 is a Cr layer and has a thickness of 0.5 μm to 3 μm.

The transition layer 3 is a CrN layer and/or a $Cr_2N$ layer and has a thickness of 1 μm to 11 μm.

The gradient layer 4 is a CrMo$_x$N layer in which Mo content progressively increases. The gradient layer 4 has a thickness of 1 μm to 11 μm.

The function layer 7 includes at least one cyclical layer (for example, 2, 3, 4, 5, 8, 10, 15, 20, 25, 30, 35 or 40 cyclical layers). FIG. 1 shows 4 cyclical layers. Each cyclical layer includes a first CrMo$_x$N layer 5 and a second CrMo$_x$N layer 6 coating on the surface of the first CrMo$_x$N layer 5. The function layer 7 has a thickness of 7.5 μm to 55 μm. The ratio of the thickness of the second CrMo$_x$N layer 6 to that of the first CrMo$_x$N layer 5 is (2-3):1.

Figure 2:
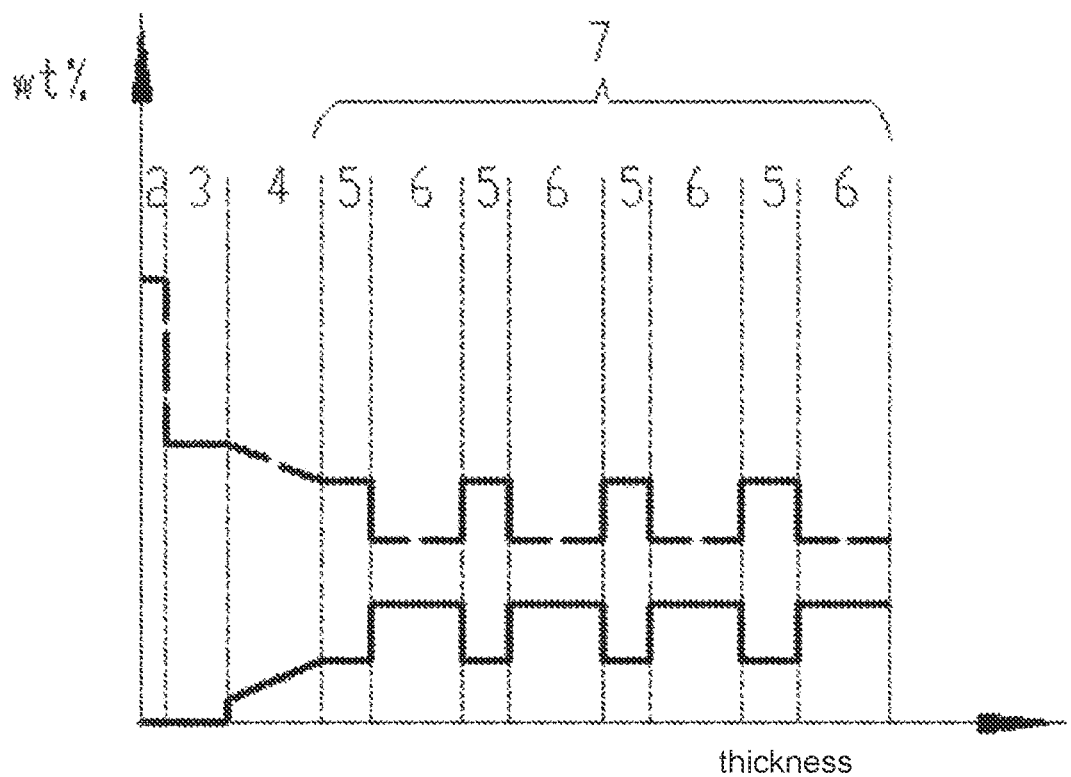
FIG. 2 is a graph showing the Cr content and the Mo content of each layer in a coating according to an embodiment of the present disclosure.

The Mo content of the first CrMo$_x$N layer 5 is lower than the Mo content of the second CrMo$_x$N layer 6. The first CrMo$_x$N layer 5 has Mo content of 3.0 wt % to 6.0 wt %. The second CrMo$_x$N layer 6 has Mo content of 10.0 wt % to 15.0 wt %. The Cr content and the Mo content of the bonding layer 2, the transition layer 3, the gradient layer 4 and the function layer 7 vary as shown in FIG. 2.

In another embodiment, the present disclosure provides a preparation method of the coating. The preparation method includes the steps described below:

(1) cleaning the surface of the substrate 1 to obtain a cleaned substrate 1; the cleaning specifically comprising:
   (a) degreasing the surface of the substrate 1 and subjecting the surface of the substrate 1 to ultrasonic cleaning, drying the substrate 1 and loading the substrate 1 into a multi-arc ion plating device, heating the substrate 1 to 380° C. to 450° C., and then vacuumizing the multi-arc ion plating device to below 5.0×10$^{-3}$ Pa; the substrate 1 may be a piston ring; and
   (b) passing 99.99% pure Ar to the multi-arc ion plating device, letting Ar ions bombarding cleaning the surface of the piston ring at a negative bias voltage of 800 V to 1200 V;
(2) depositing the adhesive layer, a Cr layer on the surface of the substrate 1 under the following process conditions: a metal Cr target as a cathode, Ar as a working reactant gas, a cathode current of 80 A to 120 A, a pressure of 1 Pa to 2 Pa, and a negative bias voltage of 17 V to 23 V applied to the substrate 1;
(3) depositing the transition layer, a CrN layer and/or a Cr$_2$N layer on the Cr layer under the following process conditions: a metal Cr target as a cathode, N$_2$ as a working reactant gas, a cathode current of 80 A to 120 A, a pressure of 4 Pa to 6 Pa, and a negative bias voltage of −30 V to −40 V applied to the substrate 1;
(4) depositing the CrMo$_x$N layer in which Mo content progressively increases under the following process conditions: a metal Cr target and a metal CrMo target as a cathode, N$_2$ as a working reactant gas, a pressure of 4 Pa to 6 Pa, a negative bias voltage of −30 V to −40 V applied to the substrate 1, and a progressively increased CrMo cathode current from 30 A to 45 A to 40 A to 55 A;
(5) depositing the first CrMo$_x$N layer 5 under the following process conditions: a metal Cr target and a metal CrMo target as a cathode, N$_2$ as a working reactant gas, a pressure of 4 Pa to 6 Pa, a negative bias voltage of −30 V to −40 V applied to the substrate 1, and a CrMo cathode current of 40 A to 55 A; and then depositing the second CrMo$_x$N layer 6 under the following process conditions: a metal Cr target and a metal CrMo target as a cathode, N$_2$ as a working reactant gas, a pressure of 4 Pa to 6 Pa, a negative bias voltage of −30 V to −40 V applied to the substrate 1, and a CrMo cathode current of 80 A to 95 A; and
(6) repeating the step (5) for 4 to 20 cycles until the end of the process duration, and taking the substrate 1 out after the furnace temperature is lower than 150° C. to obtain the coating on the surface of the substrate 1.

Total duration of deposition process of the step (2) to the step (5) is 8 h to 39 h.

Embodiment One

A coating on the surface of a piston ring is provided. The coating has a thickness of 10 μm. The coating includes an adhesive layer 2, a transition layer 3, a gradient layer 4 and a function layer 7 in sequence. The adhesive layer 2 is located on the surface of the piston ring.

The adhesive layer 2 is a Cr layer and has a thickness of 0.5 μm.

The transition layer 3 is a CrN layer and has a thickness of 1 μm.

The gradient layer 4 is a CrMo$_x$N layer in which Mo content progressively increases.

The gradient layer 4 has a thickness of 1 μm.

The function layer 7 (modulation structure) includes one cyclical layer. The cyclical layer includes a first CrMo$_x$N layer 5 and a second CrMo$_x$N layer 6 overlaying the surface of the first CrMo$_x$N layer 5. The Mo content of the first CrMo$_x$N layer 5 is lower than the Mo content of the second CrMo$_x$N layer 6. The Mo content of the first CrMo$_x$N layer 5 is 3.0 wt %. The Mo content of the second CrMo$_x$N layer 6 is 10.0 wt %. The function layer 7 has a thickness of 7.5 μm. The ration of the thickness of the second CrMo$_x$N layer 6 to that of the first CrMo$_x$N layer 5 is 2:1.

The preparation method of the coating includes the steps described below:

(1) cleaning the surface of the substrate 1 to obtain a cleaned substrate 1; the cleaning specifically comprising:
   (a) degreasing the surface of the substrate 1 and subjecting the surface of the substrate 1 to ultrasonic cleaning, drying the substrate 1 and loading the substrate 1 into a multi-arc ion plating device, heating the substrate 1 to 390° C., and then vacuumizing the multi-arc ion plating device to below 5.0×10$^{-3}$ Pa; wherein the substrate 1 is a piston ring; and
   (b) passing 99.99% pure Ar to the multi-arc ion plating device, letting Ar ions bombarding and cleaning the surface of the piston ring at a negative bias voltage of 900 V;
(2) depositing the adhesive layer, a Cr layer, on the surface of the substrate 1 under the following process conditions: a metal Cr target as a cathode, Ar as a working reactant gas, a cathode current of 85 A, a pressure of 1.2 Pa, and a negative bias voltage of −19 V applied to the substrate 1;
(3) depositing the transition layer, a CrN layer, on the Cr layer under the following process conditions: a metal Cr target as a cathode, N$_2$ as a working reactant gas, a cathode current of 85 A, a pressure of 4.2 Pa, and a negative bias voltage of 38 V applied to the substrate 1;
(4) depositing the CrMo$_x$N layer in which Mo content progressively increases under the following process conditions: a metal Cr target and a metal CrMo target as a cathode, N$_2$ as a working reactant gas, a pressure of 4.2 Pa, a negative bias voltage of 38 V applied to the substrate 1, and a progressively increased CrMo cathode current from 32 A to 42 A;
(5) depositing the first CrMo$_x$N layer 5 under the following process conditions: a metal Cr target and a metal CrMo target as a cathode, N$_2$ as a working reactant gas, a pressure of 4.2 Pa, a negative bias voltage of −38 V applied to the substrate 1, and a CrMo cathode current of 43 A; and then depositing the second CrMo$_x$N layer 6 under the following process conditions: a metal Cr target and a metal CrMo target as a cathode, N$_2$ as a working reactant gas, a pressure of 4.2 Pa, a negative bias voltage of −38 V applied to the substrate 1, and a CrMo cathode current of 82 A; and (6) taking the substrate 1 out after the furnace temperature is lower than 150° C. to obtain the coating on the surface of the substrate.

Total duration of deposition process of the step (2) to the step (5) is 8.6 h.

It is obtained from the testing of the hardness and friction coefficient of the prepared coating that the prepared coating has a friction coefficient of 0.35 and a hardness of 1800 to 1900.

Embodiment Two

A coating on the surface of a piston ring is provided. The coating has a thickness of 80 μm. The coating includes an adhesive layer 2, a transition layer 3, a gradient layer 4 and a function layer 7 in sequence. The adhesive layer 2 is located on the surface of the piston ring.

The adhesive layer 2 is a Cr layer and has a thickness of 3 μm.

The transition layer 3 is a Cr$_2$N layer and has a thickness of 11 μm.

The gradient layer 4 is a CrMo$_x$N layer in which Mo content progressively increases.

The gradient layer 4 has a thickness of 11 μm.

The function layer 7 (modulation structure) includes 20 cyclical layers. Each cyclical layer includes a first CrMo$_x$N layer 5 and a second CrMo$_x$N layer 6 overlaying the surface of the first CrMo$_x$N layer 5. The Mo content of the first CrMo$_x$N layer 5 is lower than the Mo content of the second CrMo$_x$N layer 6. The Mo content of the first CrMo$_x$N layer 5 is 6.0 wt %. The Mo content of the second CrMo$_x$N layer 6 is 15.0 wt %. The function layer 7 has a thickness of 55 μm. The thickness ratio of the second CrMo$_x$N layer 6 to the first CrMo$_x$N layer 5 is 3:1.

The preparation method of the coating includes the steps described below:

(1) cleaning the surface of the substrate 1 to obtain a cleaned substrate 1; the cleaning specifically comprising:
  (a) degreasing the surface of the substrate 1 and subjecting the surface of the substrate 1 to ultrasonic cleaning, drying the substrate 1 and loading the substrate 1 into a multi-arc ion plating device, heating the substrate 1 to 435° C., and then vacuumizing the multi-arc ion plating device to below 5.0×10$^{-3}$ Pa; wherein the substrate 1 is a piston ring.
  (b) passing 99.99% pure Ar to the multi-arc ion plating device, letting Ar ions bombarding and cleaning the surface of the piston ring at a negative bias voltage of −1100V.

(2) depositing the adhesive layer, a Cr layer, on the surface of the substrate 1 under the following process conditions: a metal Cr target as a cathode, Ar as a working reactant gas, a cathode current of 110 A, a pressure of 1.5 Pa, and a negative bias voltage of −22 V applied to the substrate 1.

(3) depositing the transition layer, a Cr$_2$N layer, on the Cr layer under the following process conditions: a metal Cr target as a cathode, N$_2$ as a working reactant gas, a cathode current of 110 A, a pressure of 5 Pa, and a negative bias voltage of 38 V applied to the substrate 1.

(4) depositing the CrMo$_x$N layer in which Mo content progressively increases under the following process conditions: a metal Cr target and a metal CrMo target as a cathode, N$_2$ as a working reactant gas, a pressure of 5 Pa, a negative bias voltage of −38 V applied to the substrate 1, and a progressively increased CrMo cathode current from 35 A to 53 A.

(5) depositing the first CrMo$_x$N layer 5 under the following process conditions: a metal Cr target and a metal CrMo target as a cathode, N$_2$ as a working reactant gas, a pressure of 5 Pa, a negative bias voltage of −38 V applied to the substrate 1, and a CrMo cathode current of 53 A; and then depositing the second CrMo$_x$N layer 6 under the following process conditions: a metal Cr target and a metal CrMo target as a cathode, N$_2$ as a working reactant gas, a pressure of 5 Pa, a negative bias voltage of −38 V applied to the substrate 1, and a CrMo cathode current of 93 A.

(6) repeating the step (5) for 20 cycles until the end of the process duration, and taking the substrate 1 out after the furnace temperature is lower than 150° C. to obtain the coating on the surface of the substrate 1.

Total duration of deposition process of the step (2) to the step (5) is 38 h.

It is obtained from the testing of the hardness and friction coefficient of the prepared coating that the prepared coating has a friction coefficient of 0.4 and a hardness of 1800 to 1900.

Embodiment Three

A coating on the surface of a piston ring is provided. The coating has a thickness of 60 μm. The coating includes an adhesive layer 2, a transition layer 3, a gradient layer 4 and a function layer 7 in sequence. The adhesive layer 2 is in direct contact with the surface of the substrate 1.

The adhesive layer 2 is a Cr layer and has a thickness of 2 μm.

The transition layer 3 is a CrN layer and has a thickness of 5 μm.

The gradient layer 4 is a CrMo$_x$N layer in which Mo content progressively increases. The gradient layer 4 has a thickness of 5 μm.

The function layer 7 (modulation structure) includes 4 cyclical layers. Each cyclical layer includes a first CrMo$_x$N layer 5 and a second CrMo$_x$N layer 6 overlaying the surface of the first CrMo$_x$N layer 5. The Mo content of the first CrMo$_x$N layer 5 is lower than the Mo content of the second CrMo$_x$N layer 6. The Mo content of the first CrMo$_x$N layer 5 is 5.0 wt %. The Mo content of the second CrMo$_x$N layer 6 is 12.0 wt %. The function layer 7 has a thickness of 48 μm. The thickness ratio of the second CrMo$_x$N layer 6 to the first CrMo$_x$N layer 5 is 2.5:1.

The preparation method of the coating includes the steps described below:

(1) cleaning the surface of the substrate 1 is cleaned to obtain a cleaned substrate 1; the clean specifically comprising:
  (a) degreasing the surface of the substrate 1 and subjecting the surface of the substrate 1 to ultrasonic cleaning, drying the substrate 1 and loading the substrate 1 into a multi-arc ion plating device, heating the substrate 1 to 420° C., and then vacuumizing the multi-arc ion plating device to below 5.0×10$^{-3}$ Pa; wherein the substrate 1 is a piston ring; and
  (b) passing 99.99% pure Ar to the multi-arc ion plating device, letting Ar ions bombarding and cleaning the surface of the piston ring at a negative bias voltage of −1,000 V;

(2) depositing the adhesive layer, a Cr layer, on the surface of the substrate 1 under the following process conditions: a metal Cr target as a cathode, Ar as a working reactant gas, a cathode current of 100 A, a pressure of 1.7 Pa, and a negative bias voltage of −20 V applied to the substrate 1;

(3) depositing the transition layer, a CrN layer, on the Cr layer under the following process conditions: a metal Cr target as a cathode, $N_2$ as a working reactant gas, a cathode current of 100 A, a pressure of 5.2 Pa, and a negative bias voltage of −35V applied to the substrate 1;

(4) depositing the $CrMo_xN$ layer in which Mo content progressively increases under the following process conditions: a metal Cr target and a metal CrMo target as a cathode, $N_2$ as a working reactant gas, a pressure of 5.2 Pa, a negative bias voltage of −35 V applied to the substrate 1, and a progressively increased CrMo cathode current from 33 A to 49 A;

(5) depositing the first $CrMo_xN$ layer 5 under the following process conditions: a metal Cr target and a metal CrMo target as a cathode, $N_2$ as a working reactant gas, a pressure of 5.2 Pa, a negative bias voltage of 35 V applied to the substrate 1, and a CrMo cathode current of 50 A; and then depositing the second $CrMo_xN$ layer 6 under the following process conditions: a metal Cr target and a metal CrMo target as a cathode, $N_2$ as a working reactant gas, a pressure of 5.2 Pa, a negative bias voltage of −35 V applied to the substrate 1, and a CrMo cathode current of 89 A; and (6) repeating the step (5) for 4 cycles until the end of the process duration, and taking the substrate 1 out after the furnace temperature is lower than 150° C. to obtain the coating on the surface of the substrate 1.

Total duration of deposition process of the step (2) to the step (5) is 30 h.

It is obtained from the testing of the hardness and friction coefficient of the prepared coating that the prepared coating has a friction coefficient of 0.32 and a hardness of 1800 to 1900.

Applicants state that the above are only embodiments of the present disclosure, but the scope of the present disclosure is not limited thereto. Those skilled in the art will appreciate that any variation or substitution that is easily conceivable within the technical scope of the present disclosure by those skilled in the art falls within the scope of the present disclosure.

What is claimed is:

1. A coating able to reduce friction and wear, wherein the coating is located on a surface of a substrate and the coating comprises an adhesive layer, a transition layer, a gradient layer and a function layer in sequence in a direction away from the surface of the substrate, wherein
    the gradient layer is a $CrMo_xN$ layer in which Mo content progressively increases from 2.0-3.0 wt % to 3.0-6.0 wt %; and
    the function layer comprises at least one cyclical layer, each cyclical layer comprises a first $CrMo_xN$ layer and a second $CrMo_xN$ layer in sequence from bottom to top, and a Mo content of the first $CrMo_xN$ layer is lower than a Mo content of the second $CrMo_xN$ layer.

2. The coating of claim 1, wherein the first $CrMo_xN$ layer has a Mo content of 3.0 wt % to 6.0 wt %; and
    the second $CrMo_xN$ layer has a Mo content of 10.0 wt % to 15.0 wt %.

3. The coating of claim 1, wherein the function layer comprises 4 to 20 cyclical layers.

4. The coating of any one of claim 1, wherein the adhesive layer is a Cr layer.

5. The coating of claim 1, wherein the transition layer is a CrN layer and/or a Cr2N layer.

6. The coating of claim 1, wherein the substrate is a piston ring made of steel and/or cast iron.

7. The coating of any one of claim 1, wherein the coating has a thickness of 10 μm to 80 μm.

8. The coating of claim 1, wherein the function layer has a thickness of 7.5 μm to 55 μm.

9. The coating of claim 1, wherein a ratio of the thickness of the second $CrMo_xN$ layer to that of the first $CrMo_xN$ layer is (2-3):1.

10. The coating of claim 1, wherein the adhesive layer has a thickness of 0.5 μm to 3 μm.

11. The coating of claim 1, wherein the transition layer has a thickness of 1 μm to 11 μm.

12. The coating of claim 1, wherein the gradient layer has a thickness of 1 μm to 11 μm.

13. A piston ring provided with the coating of claim 1.

14. A preparation method of the coating of claim 1, comprising the following steps:
    (1) cleaning the surface of the substrate to obtain a cleaned substrate;
    (2) depositing the adhesive layer on the surface of the substrate by using a multi-arc ion plating device;
    (3) depositing the transition layer on a surface of the adhesive layer by using the multi-arc ion plating device;
    (4) depositing the gradient layer on a surface of the transition layer by using the multi-arc ion plating device; and
    (5) depositing the at least one cyclical layer on a surface of the gradient layer by using the multi-arc ion plating device to form the function layer and obtain the coating.

15. The preparation method of claim 14, wherein the cleaning in the step (1) comprises the following steps:
    (a) degreasing the surface of the substrate, subjecting the surface of the substrate to ultrasonic cleaning, drying the substrate, loading the substrate into the multi-arc ion plating device, heating the substrate to 380° C. to 450° C., and then vacuumizing the multi-arc ion plating device to below $5.0 \times 10^{-3}$ Pa; and
    (b) passing 99.99% pure Ar to the multi-arc ion plating device, letting Ar ions bombarding and cleaning the surface of the substrate at a negative bias voltage of −800 V to −1200 V.

16. The preparation method of claim 14, wherein process conditions for the depositing the adhesive layer in the step (2) comprise: a metal Cr target as a cathode, Ar as a working reactant gas, a cathode current of 80 A to 120 A, a pressure of 1 Pa to 2 Pa, and a negative bias voltage of −17 V to −23 V applied to the substrate;
    process conditions for the depositing the transition layer in the step (3) comprise: a metal Cr target as a cathode, $N_2$ as a working reactant gas, a cathode current of 80 A to 120 A, a pressure of 4 Pa to 6 Pa, and a negative bias voltage of −30 V to −40 V applied to the substrate;
    process conditions for the depositing the gradient layer in the step (4) comprise a metal Cr target and a metal CrMo target as a cathode, $N_2$ as a working reactant gas, a pressure of 4 Pa to 6 Pa, a negative bias voltage of −30 V to −40 V applied to the substrate, and a progressively increased CrMo cathode current from 30 A to 45 A to 40 A to 55 A; and
    process conditions for the depositing the at least one cyclical layer in the step (5) comprise: a metal Cr target and a metal CrMo target as a cathode, $N_2$ as a working reactant gas, a pressure of 4 Pa to 6 Pa, a negative bias voltage of −30 V to −40 V applied to the substrate, and a CrMo cathode current of 40 A to 55 A, for depositing the first CrMoxN layer; and then a metal Cr target and a metal CrMo target as a cathode, $N_2$ as a working reactant gas, a pressure of 4 Pa to 6 Pa, a negative bias voltage of −30 V to −40 V applied to the substrate, and a CrMo cathode current of 80 A to 95 A, for depositing the second CrMoxN layer.

17. The preparation method of claim 14, wherein the step (5) comprises depositing 4 to 20 cyclical layers.

18. The preparation method of claim 14, wherein total duration of deposition process of the step (2) to the step (5) is 8 h to 39 h.

19. The preparation method of claim 14, comprising the following steps:
 (1) cleaning the surface of the substrate to obtain the cleaned substrate, wherein the cleaning comprises:
 (a) degreasing the surface of the substrate, subjecting the surface of the substrate to ultrasonic cleaning, drying the substrate, loading the substrate into the multi-arc ion plating device, heating the substrate to 380° C. to 450° C., and then vacuumizing the multi-arc ion plating device to below $5.0 \times 10^{-3}$ Pa; and
 (b) passing the 99.99% pure Ar to the multi-arc ion plating device, letting Ar ions bombarding and cleaning the surface of the substrate at the negative bias voltage of −800 V to −1200 V;
 (2) depositing the adhesive layer, a Cr layer, on the surface of the substrate under the following process conditions: a metal Cr target as a cathode, Ar as a working reactant gas, a cathode current of 80 A to 120 A, a pressure of 1 Pa to 2 Pa, and a negative bias voltage of −17 V to −23 V applied to the substrate;
 (3) depositing the transition layer, a CrN layer and/or a $Cr_2N$ layer, on the Cr layer under the following process conditions: a metal Cr target as a cathode, $N_2$ as a working reactant gas, a cathode current of 80 A to 120 A, a pressure of 4 Pa to 6 Pa, and a negative bias voltage of −30 V to −40 V applied to the substrate;
 (4) depositing the $CrMo_xN$ layer in which Mo content progressively increases under the following process conditions: a metal Cr target and a metal CrMo target as a cathode, $N_2$ as a working reactant gas, a pressure of 4 Pa to 6 Pa, a negative bias voltage of −30 V to −40 V applied to the substrate, and a progressively increased CrMo cathode current from 30 A to 45 A to 40 A to 55A;
 (5) depositing the first $CrMo_xN$ layer under the following process conditions: a metal Cr target and a metal CrMo target as a cathode, $N_2$ as a working reactant gas, a pressure of 4 Pa to 6 Pa, a negative bias voltage of −30 V to −40 V applied to the substrate, and a CrMo cathode current of 40 A to 55 A; and then depositing the second $CrMo_xN$ layer under the following process conditions: a metal Cr target and a metal CrMo target as a cathode, $N_2$ as a working reactant gas, a pressure of 4 Pa to 6 Pa, a negative bias voltage of −30 V to −40 V applied to the substrate, and a CrMo cathode current of 80 A to 95 A; and
 (6) repeating the step (5) for 4 to 20 cycles until the end of a process duration, and taking out the substrate after a furnace temperature is lower than 150° C., to obtain the coating on the surface of the substrate,
wherein total duration of deposition process from the step (2) to the step (5) is 8 h to 39 h.

* * * * *